United States Patent
Roth

(10) Patent No.: US 10,759,714 B2
(45) Date of Patent: Sep. 1, 2020

(54) METHOD FOR PRODUCING A METAL-CERAMIC SUBSTRATE

(71) Applicant: Infineon Technologies AG, Neubiberg (DE)

(72) Inventor: Alexander Roth, Zeitlarn (DE)

(73) Assignee: Infineon Technologies AG, Neubiberg (DE)

( * ) Notice: Subject to any disclaimer, the term of this patent is extended or adjusted under 35 U.S.C. 154(b) by 184 days.

(21) Appl. No.: 15/720,462

(22) Filed: Sep. 29, 2017

(65) Prior Publication Data

US 2018/0093927 A1 Apr. 5, 2018

(30) Foreign Application Priority Data

Sep. 30, 2016 (EP) .................................. 16191691

(51) Int. Cl.
*H01K 3/10* (2006.01)
*C04B 37/02* (2006.01)
(Continued)

(52) U.S. Cl.
CPC ............ *C04B 37/026* (2013.01); *C04B 37/02* (2013.01); *C04B 37/021* (2013.01); *H05K 1/0263* (2013.01); *H05K 1/0306* (2013.01); *H05K 3/06* (2013.01); *H05K 3/28* (2013.01); *H05K 3/38* (2013.01); *C04B 2235/6567* (2013.01); *C04B 2235/6584* (2013.01); *C04B 2235/6586* (2013.01); *C04B 2237/12* (2013.01);
(Continued)

(58) Field of Classification Search
CPC .. C04B 37/026; C04B 37/021; H05K 1/0263; H05K 1/0306; H05K 3/06; H05K 3/28; H05K 3/38; Y10T 29/49128; Y10T 29/4913; Y10T 29/49155; Y10T 29/49163
USPC ................................... 29/831, 832, 845, 851
See application file for complete search history.

(56) References Cited

U.S. PATENT DOCUMENTS 3,107,756 A * 10/1963 Gallet .................. B23K 35/001
428/552
3,766,634 A 10/1973 Babcock et al.
(Continued)

FOREIGN PATENT DOCUMENTS

CN 101543151 A 9/2009
CN 102754204 A 10/2012
(Continued)

*Primary Examiner* — Donghai D Nguyen
(74) *Attorney, Agent, or Firm* — Murphy, Bilak & Homiller, PLLC

(57) ABSTRACT

A method for producing a metal-ceramic substrate includes attaching a metal layer to a surface side of a ceramic layer, the metal layer being structured into a plurality of metallization regions respectively separated from one another by at least one trench-shaped intermediate space to form conductive paths and/or connective surfaces and/or contact surfaces. The method further includes filling the at least one trench-shaped intermediate space with an electrically insulating filler material, and covering first edges of the metallization regions facing and adjoining the surface side of the ceramic layer in the at least one trench-shaped intermediate space, as well as at least one second edge of the metallization regions facing away from the surface side of the ceramic layer in the at least one trench-shaped intermediate space, by the electrically insulating filler material.

10 Claims, 2 Drawing Sheets

(51) Int. Cl.
  *H05K 1/02*  (2006.01)
  *H05K 1/03*  (2006.01)
  *H05K 3/06*  (2006.01)
  *H05K 3/28*  (2006.01)
  *H05K 3/38*  (2006.01)

(52) U.S. Cl.
  CPC .. *C04B 2237/341* (2013.01); *C04B 2237/343* (2013.01); *C04B 2237/366* (2013.01); *C04B 2237/368* (2013.01); *C04B 2237/402* (2013.01); *C04B 2237/407* (2013.01); *C04B 2237/408* (2013.01); *C04B 2237/70* (2013.01); *C04B 2237/86* (2013.01); *H05K 2201/0195* (2013.01); *H05K 2201/09881* (2013.01); *H05K 2203/1121* (2013.01)

(56) References Cited

U.S. PATENT DOCUMENTS

| | | | |
|---|---|---|---|
| 3,915,369 | A | 10/1975 | Schmidt-Bruecken et al. |
| 4,521,449 | A * | 6/1985 | Arnold .................. H01L 21/486 29/851 |
| 8,257,529 | B2 * | 9/2012 | Sugimoto ............. C03C 14/004 156/89.11 |
| 2005/0145595 | A1 | 7/2005 | Cubero Pitel |
| 2012/0293964 | A1 * | 11/2012 | Greuter ............... H01L 23/3735 361/728 |
| 2018/0093927 | A1 | 4/2018 | Roth |

FOREIGN PATENT DOCUMENTS

| | | |
|---|---|---|
| DE | 2213115 A1 | 9/1973 |
| DE | 2319854 A1 | 10/1973 |
| DE | 20320759 U1 | 2/2005 |
| DE | 102010024520 A1 | 12/2011 |
| DE | 102013013842 B4 | 10/2015 |
| EP | 0153618 A2 | 9/1985 |
| EP | 2337070 A1 | 6/2011 |
| EP | 3301802 A1 | 4/2018 |
| GB | 2418538 A | 3/2006 |
| JP | 2004059375 A | 2/2004 |
| JP | 2014022514 A | 2/2014 |

* cited by examiner

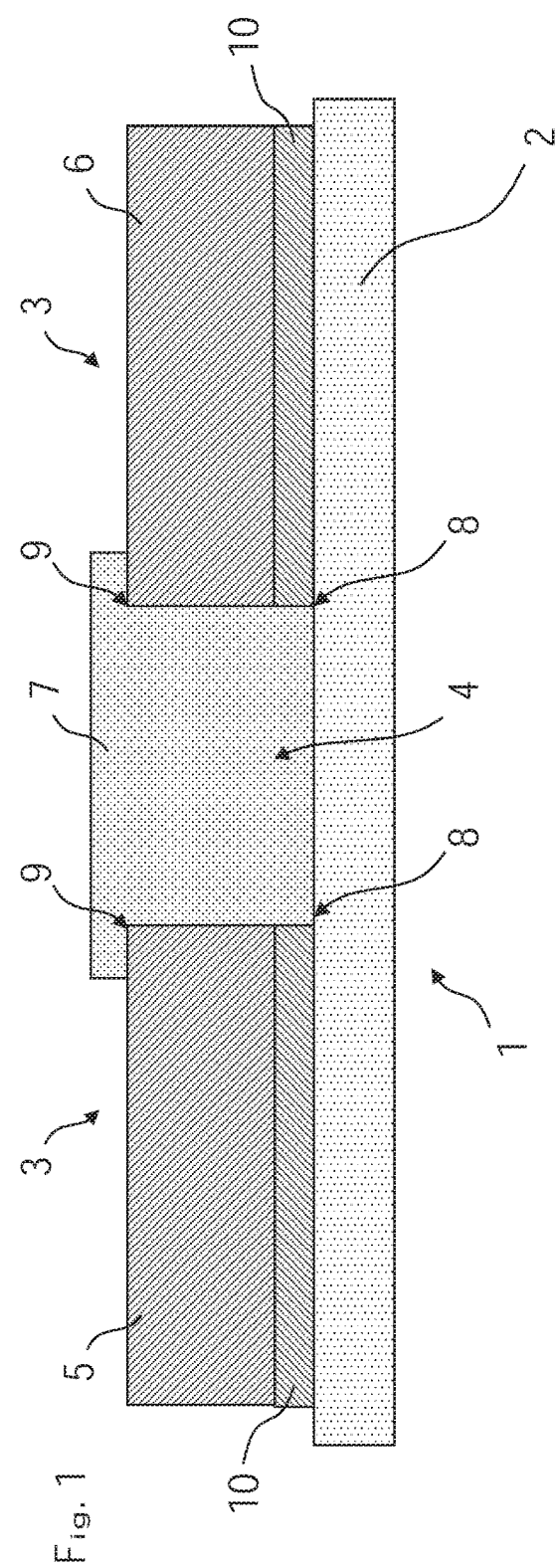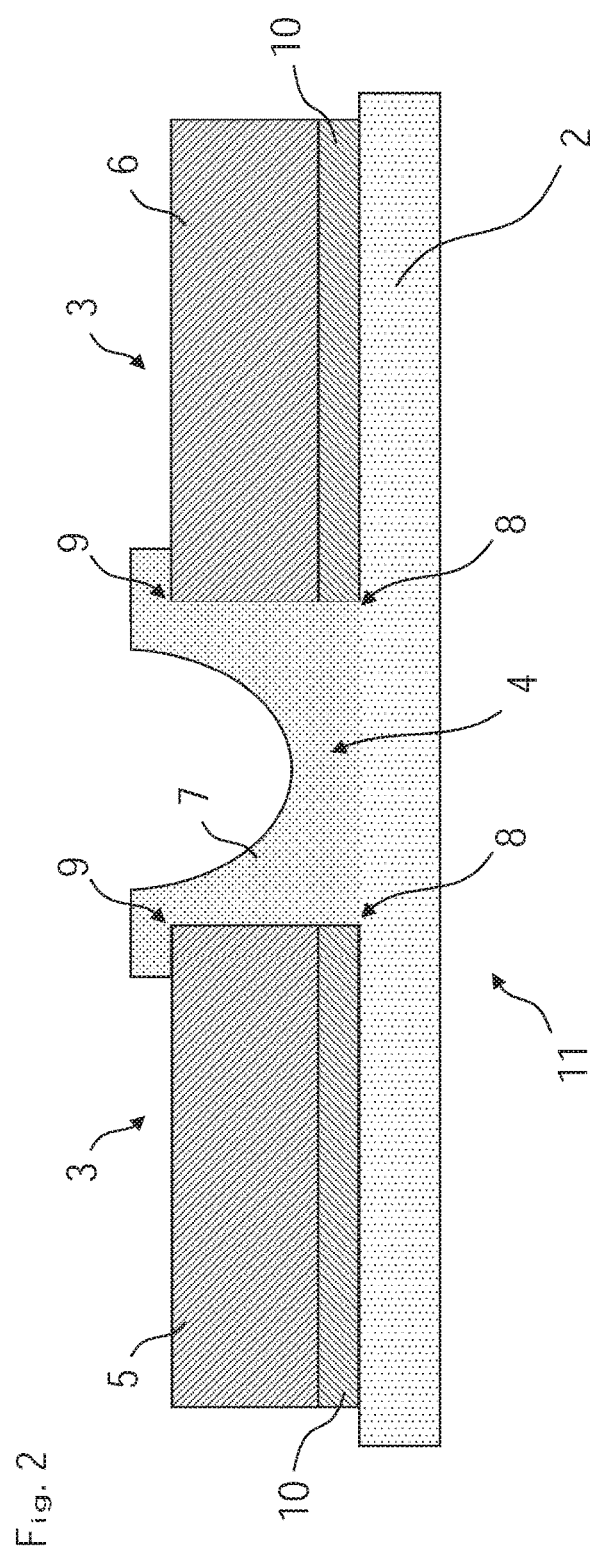

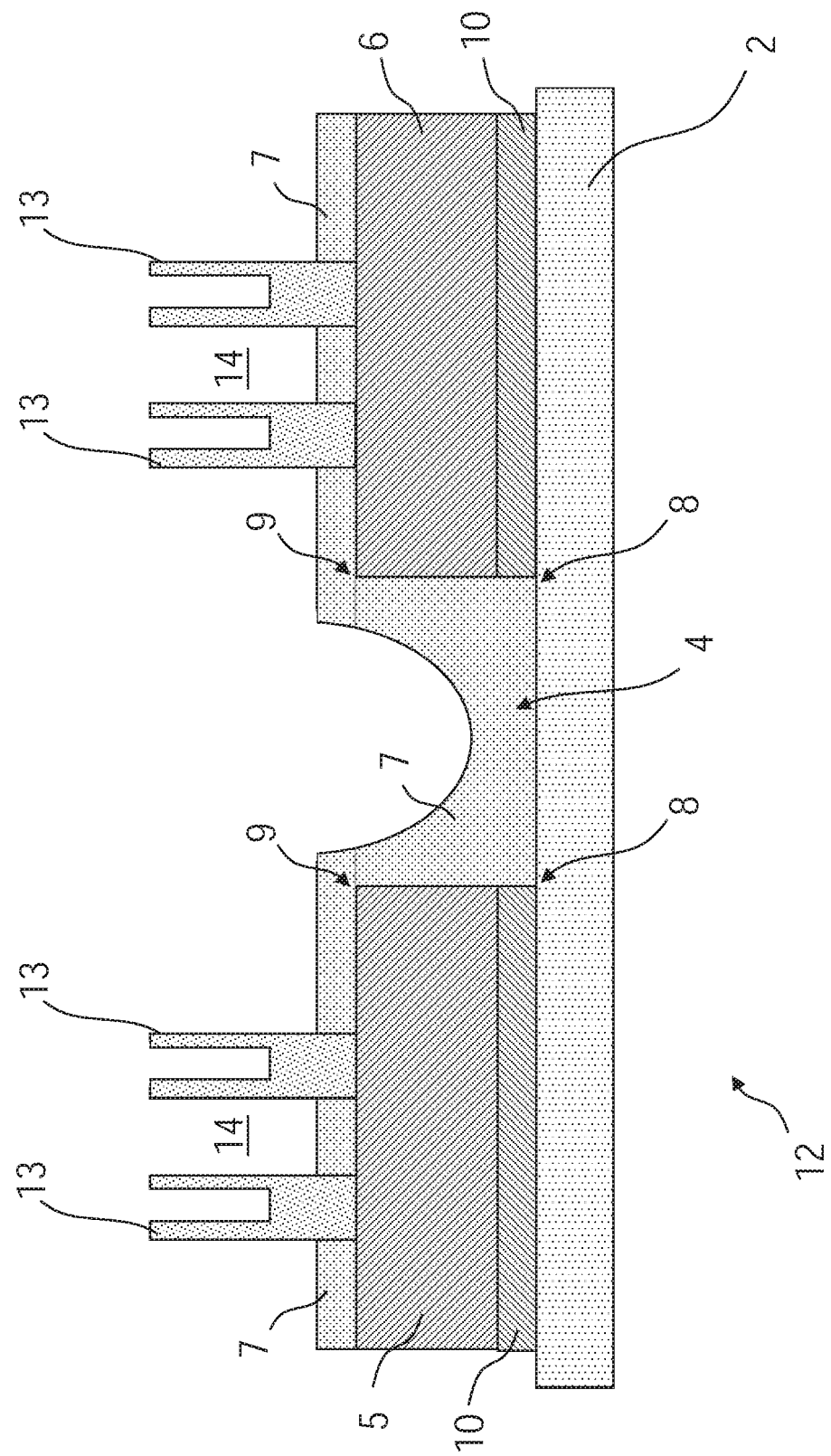

METHOD FOR PRODUCING A METAL-CERAMIC SUBSTRATE

TECHNICAL FIELD

The present invention relates to metal-ceramic substrates, and methods for producing metal-ceramic substrates.

BACKGROUND

Metal-ceramic substrates are preferably used in the field of semiconductor power modules. In doing so, a ceramic plate or ceramic layer, such as an aluminum-oxide ceramic, is provided on at least one of its surface sides, such as the top and/or bottom side, with a metallization, wherein a circuitry structure, such as conductive paths, contact surfaces, and/or connective surfaces, produced, for example, by etching processes, is introduced into at least one metallized side. Such ceramic substrates with metallization are used, for example, as circuit carriers for electronic power modules, in which they ensure the thermal and mechanical connection, as well as the electrical insulation.

The application of a metallization to a ceramic substrate can take place using a method as described in DE 23 19 854 A, for example. In the process, a metal part, such as a copper plate or a copper foil, is provided on the surface sides with a coat made of a chemical compound of the metal and a reactive gas—in particular, oxygen. This coat forms a eutectic with a thin layer of the adjacent metal, the eutectic having a melting temperature below the melting temperature of the metal. The metal part is then placed onto the ceramic substrate and heated together with the ceramic to a temperature above the melting point of the eutectic and below the melting temperature of the metal. Essentially, only the eutectic intermediate layer is thereby melted. After cooling, the metal part and the ceramic substrate are then joined to each other. When using copper or a copper alloy as the metal, this method is also called DCB bonding or DCB process (DCB: Direct Copper Bonding), but the method can also be performed using other metals. The DCB process comprises, for example, the following process steps:

Oxidizing of a copper foil, such that an even copper oxide layer is formed;
Placing the copper foil onto the ceramic layer;
Heating of the composite to a process temperature between approximately 1025 and 1083° C., e.g., to approximately 1071° C.; and
Cooling to room temperature.

The material composite obtained thereby, i.e., the metal-ceramic substrate, can then be processed further in the manner desired.

Another known method for producing a thick metallization on a ceramic substrate is the so-called active brazing process (AMB: Active Metal Brazing) as used, for example, in DE 22 13 115 A or EP 153 618 A2. In this process, a joint between a metal foil and a ceramic substrate is produced at a temperature between approximately 800 and 1200° C. using a hard solder that also contains an active metal in addition to a main component, such as copper, silver, and/or gold. This active metal, such as at least one element of the group Hf, Ti, Zr, Nb, or Ce, produces a joint between the solder and the ceramic by chemical reaction, while the joint between the solder and the metal is formed by a metallic hard-solder joint.

In both processes, high temperatures are used, whereby the metallization already exerts forces on the underlying ceramic substrate during cooling to room temperature due to the different thermal expansion coefficients. In addition, such a metal-ceramic substrate is subject to thermal fluctuations when used as a substrate for electronic components or assemblies due to the resultant power loss, whereby stress forces on the ceramic layer can develop in the region of the edge of the metallization, which stress forces can result in cracking in the ceramic layer and thus to a destruction of the metal-ceramic substrate or the electronic assembly. In order to avoid such temperature-related stresses, a method for increasing the thermo-mechanical resistance of a metal-ceramic substrate is, for example, known from DE 10 2010 024 520 A1, in which method the edges that exist between the metallization and the ceramic layer are covered by applying an electrically insulating filler material after applying and structuring the metallization. The filler material can, for example, be a temperature-resistant polymer material or a material made of glass or ceramics.

A method for producing a metal-ceramic substrate is also known from DE 10 2013 013 842 B4, in which method cracks existing at the edge region of the metallization between the ceramic and the metal and/or extending into the ceramic are filled or grouted with a curable sealing material, wherein, after the filling or grouting of the sealing material, edge regions of the metallization are covered by the sealing material to a height of at most 50% of the thickness of the metallization.

A task of the metal-ceramic substrate, after the introduction mentioned above of circuitry structures into the metallization, is the separation of different electrical potentials on the same side of the substrate by trench-shaped intermediate spaces in the metallization. e.g., using conductive paths, contact surfaces, and/or connective surfaces spaced apart from each other by the intermediate spaces. These intermediate spaces, herein also called etched trenches, are generally relatively small due to the limited space available or the high packing density on the metal-ceramic substrate, which, consequently, can result in a relatively high electric field strength in these trenches between adjacent metallization regions of differing electrical potentials. Under unfavorable environmental conditions during the use of the metal-ceramic substrate, e.g., in case of hydrogen sulfide ($H_2S$) residues in the air and moisture, electromigration (=dendrite growth) can start at these points of high electric field strength at the metallization and/or its metallic joint to the ceramic layer (active solder). Ultimately, if the electromigration progresses between the metallization regions involved, a short circuit can form between them, which finally results in the destruction of the metal-ceramic substrate or the electric or electronic components—in particular, semiconductor components—carried by them.

SUMMARY

Against this background, the present invention is based upon the aim of providing a method for producing a metal-ceramic substrate, as well as a metal-ceramic substrate, in which the electromigration—particularly in the region of the adjacent edge regions of the metallization that are spaced apart from each other by trench-shaped intermediate spaces—is at least significantly reduced, or even completely prevented. Moreover, the metal-ceramic substrate should be easy to produce.

It should be pointed out that the features explained individually in the following description can be combined with one another in any technically reasonable manner and illustrate additional embodiments of the invention. The description additionally characterizes and specifies the invention, particularly in connection with the figures.

According to the invention, in a method for producing a metal-ceramic substrate, at least one metal layer is attached to at least one surface side of a ceramic layer, which metal layer is structured into several metallization regions respectively separated from one another by at least one trench-shaped intermediate space to form conductive paths and/or connective surfaces and/or contact surfaces. Furthermore, according to the invention, at least the intermediate space is filled with an electrically insulating filler material. In doing so, first edges of the metallization regions facing and adjoining the surface side of the ceramic layer in the intermediate space, as well as at least one second edge of the metallization regions facing away from the surface side of the ceramic layer in the intermediate space, are covered by the filler material.

The production of the metal-ceramic substrate preferably takes place using the DCB or AMB method, as briefly explained in the introductory part of the description and known from the prior art. It is, however, also possible to apply the metal layer to the ceramic substrate or the ceramic layer using a different method, e.g., by galvanic separation. In the process, the covering of the lower and upper edges of the metallization regions in the trench-shaped intermediate space takes place independently of the method steps for applying the metallization to the ceramic layer.

By introducing the filler material into at least the intermediate space of the metallization regions, which intermediate space, as explained above, is generally a place of high electric field strength during the later use of the metal-ceramic substrate as an electric circuit—in particular, as a power circuit—the process of electrochemical migration is at least delayed, or even completely prevented. In doing so, it is a significant advantage that, in addition to the lower edge, which adjoins the ceramic layer, of the respective metallization region, the upper edge, in particular, which faces away from the ceramic layer, of the respective metallization regions is also covered by the filler material, since in this way, according to the invention, the electric flux lines that would otherwise exit at the upper edge of the respective metallization region are now also led into the electrically isolating filler material. Thereby, the filler material serves as a dielectric, wherein the electrical insulating property of the filler material should be ensured in at least an operating temperature range of the metal-ceramic substrate—preferably, approximately −50° C. to approximately 250° C.

Furthermore, the filler material introduced into at least the trench-shaped intermediate space also prevents the introduction of moisture and gas, such as $H_2S$, into this region of high electric field strength during the use of the metal-ceramic substrate as a circuit—in particular, as a power circuit—and thus prevents the formation of aqueous molecular layers in the intermediate space between the metallization regions spaced apart by said intermediate space, which molecular layers are a requirement for the occurrence of electromigration in this region. This property of the filler material should also be ensured in at least the operating temperature range of the metal-ceramic substrate—preferably, approximately −50° C. to approximately 250° C.

According to an advantageous embodiment of the invention, the filling of at least the intermediate space with the filler material includes introducing the filler material in the form of a powder or a viscous material into at least the intermediate space and subsequently thermally or chemically treating the powder or the viscous material to harden the filler material. In other words, the filler material is first applied to the metal-ceramic substrate as a powder or viscous material and thereby introduced, in particular, into the trench-shaped intermediate spaces. Afterwards, the powder or viscous material is set or hardened by thermal or chemical processes. The hardening of the filler material depends upon its chemical composition and can take place by cooling, heating, or UV radiation, for example.

For easier filling of the trench-shaped intermediate spaces, another advantageous embodiment of the invention provides that the filler material—in particular, a filler material in the form of a powder or viscous material—is compacted by vibration into at least the trench-shaped intermediate space. A bubble-free and cavity-free filling of at least the intermediate space can thereby be achieved in a particularly advantageous manner. As a result, undesired partial discharges, which can occur in the bubbles or cavities of the hardened filler material during the later use of the metal-ceramic substrate as a circuit—in particular, as a power circuit—due to the high electric field strength generally present in the intermediate space, can be avoided.

Another advantageous embodiment of the invention provides that the filler material be filled at the substrate level into at least the intermediate space. In other words, in this embodiment, the filler material is filled into at least the trench-shaped intermediate space before any electric or electronic component, such as a semiconductor component, is mounted onto the metal layer, for which the metal-ceramic substrates can be used as a carrier. The particular advantage therein is to be seen in that the application of the filler material to the metal-ceramic substrate is not impeded or limited by the electric or electronic components and can thus be carried out easily. In this case, for example, a thermal treatment of the filler material, in particular, in order to harden it—e.g., in particular, a heating of the filler material—is not limited by the maximum permissible, damage-free storage temperature of the electric or electronic components—especially, of sensitive semiconductor components.

Metallization regions that possibly have to be kept free of filler material, such as connective surfaces and/or contact surfaces, can be covered as needed prior to applying the filler material to the metal-ceramic substrate, e.g., by using an appropriately shaped covering element or covering tool.

An alternative, advantageous embodiment of the invention provides that the filler material be filled at the module level into at least the intermediate space. In other words, the application of the filler material to the metal-ceramic substrate or the introduction of the filler material into the trench-shaped intermediate space does not take place until after at least one electric or electronic component—in particular, a semiconductor component—is mounted onto the metal layer. Prior to applying the filler material, all electric or electronic components, for which the metal-ceramic substrate is to serve as a carrier, are preferably mounted onto the metal-ceramic substrate. In this case, however, the maximum permissible, damage-free storage temperature of the electric or electronic components must be taken into consideration in, for example, a thermal treatment for hardening the filler material, as well as the maximum permissible temperature, at which the connection between the component and the metallization of the metal-ceramic substrate starts to loosen. Preferably used in this case are filler materials that have a hardening temperature below the damage-free storage temperature of the electric or electronic components and below the critical temperature of the joint between the component and the metallization. On the other hand, the application of the filler material to the metal-ceramic substrate and, in particular, into the trench-shaped intermediate spaces at the module level is made easier, since fewer connective surfaces and/or contact surfaces, or none at all, must be kept free of filler material.

Preferably, the critical temperature of the joint of the component with the metallization of the metal-ceramic substrate can also be increased by so-called silver sintering, in which the electric or electronic components are sintered onto the metallization of the substrate using silver particles, which may be provided with organic additives. In this way, the silver particles can already be joined to one another at temperatures of approximately 200° C. in order to produce a sintered joining layer between the component and the metallization of the substrate, even though the melting point of elemental silver is 961° C. This type of joint offers a significantly higher reliability compared to standard soldered joints, since there is a significant gap between the melting temperature of the sinter layer and the operating temperature of the electronic power components. Accordingly, a thermal treatment of the filler material—in particular, a heating of the filler material—for example, in order to harden it—can also be carried out at higher temperatures, which extends the selection of usable filler materials.

Another advantageous embodiment of the invention provides that at least one surface side, on which the trench-shaped intermediate space exists, of the metal-ceramic substrate is substantially completely covered with the filler material. In this way, the application of the filler material to the metal-ceramic substrate is made even easier, since the filler material need not be limited to only the trench-shaped intermediate spaces. In this way, the filler material can also provide a complete electrical insulation of the metal-ceramic substrate, so that an additional electrical insulation of the metal-ceramic substrate can be dispensed with. Naturally, this additional electrical insulation can nevertheless also be applied to the metal-ceramic substrate. In the process, the filler material preferably forms an intermediate layer between the metal-ceramic substrate and the additionally applied insulating layer.

According to another advantageous embodiment of the invention, at least one electrical connector is connected to a connective surface provided for this purpose of the associated metallization region, prior to filling at least the intermediate space with the filler material. In this case, at least a section of the connector for allowing an external electrical connection to the metallization region extends from the metallization region into a free space surrounding the metal-ceramic substrate. Preferably, all such connective surfaces that are to be contacted electrically outside of the substrate are provided with such an electrical connector prior to applying the filler material, so that these connective surfaces also need not be kept clear separately during application of the filler material, whereby the method according to the invention is once again simplified.

According to another advantageous embodiment of the invention, functional fillers are added to the filler material, to adapt its thermal expansion coefficient and/or to prevent it from cracking. By adapting the thermal expansion coefficient to that of the metallization and/or the ceramic of the metal-ceramic substrate, lower mechanical stresses occur in thermal cycles. This results in an increased reliability or useful life of the material composite produced.

According to a particularly preferred embodiment of the invention, a glass material, possibly with additional fillers, is used as filler material. The glass material can, for example, be a Bi—Zn—B glass material or the like, which can be fired in a temperature range between approximately 400° C. and 900° C. Due to its relatively high firing temperature, such a glass material is particularly suitable as filler material that is applied at the substrate level, i.e., without electric or electronic components mounted onto the metal-ceramic substrate, and fired.

As a glass material that is suitable for being applied to the metal-ceramic substrate at the module level, i.e., when electric or electronic components exist on the metal-ceramic substrate, ternary glass materials made of the boron-bismuth family are preferred, which are preferably lead-free, such as $Bi_2O_3$—$B_2O_3$—$ZnO$ (herein also referred to as BZB), $Bi_2O_3$—$ZnO$—$SiO_2$ (herein also referred to as BZS), $P_2O_3$—$B_2O_3$—$ZnO$ (herein also referred to as PBZ), or a vanadium glass which melts at a low temperature. These glass materials are characterized by a firing temperature of less than 700° C.—preferably between approximately 250° C. and 600° C. and particularly preferably between approximately 400° C. and 500° C.

As functional fillers, particles, such as aluminum oxide ($Al_2O_3$), aluminum nitride (AlN), or boron nitride (BN), up to a maximum of approximately 35% by volume, can, for example, be added to the glass materials in order to adapt the thermal expansion coefficient or the thermal conductivity of the filler material in the manner desired. Particularly preferably, the thermal expansion coefficient of the filler material is less than 75 ppm/K, such as with BZB, which has a thermal expansion coefficient of approximately 10 ppm/K.

As another particulate filler, zirconium dioxide (ZrO2) can, for example, be selected, in order to prevent cracking in the filler material. The prevention of cracking in the filler material can alternatively or additionally also be achieved using fibrous fillers, such as ceramic fibers made of SiC, $Si_3N_4$, or one of the aforementioned materials.

Basically, the filler material can be a lot of different substances, as long as they are sufficiently temperature-resistant, i.e., can withstand temperatures of up to 200 or 250° C. without phase or structure changes. The filler material must, naturally, be a dielectric material that is electrically insulating in the operating temperature range of the metal-ceramic substrate—preferably, approximately −50° C. to approximately 250° C.—and must firmly adhere to both the metallization and the ceramic after hardening. Therefore, filler materials that have an adhesive force at the metal layer and at the ceramic layer of the metal-ceramic substrate of at least 2 N/mm are particularly preferred. Furthermore, filler materials are preferred that are moisture-resistant and gas-tight in at least the operating temperature range of the metal-ceramic substrate of preferably approximately −50° C. to approximately 250° C.

According to another aspect of the present invention, a metal-ceramic substrate is disclosed, which comprises at least one ceramic layer and at least one metal layer attached to at least one surface side of the ceramic layer, which metal layer is structured into several metallization regions respectively separated from one another by at least one trench-shaped intermediate space to form conductive paths and/or connective surfaces and/or contact surfaces. According to the invention, at least the intermediate space is filled with an electrically insulating filler material. Moreover, first edges of the metallization regions facing and adjoining the surface side of the ceramic layer in the intermediate space, as well as at least one second edge of the metallization regions facing away from the surface side of the ceramic layer in the intermediate space, are covered by the filler material.

With regard to the advantages and effects of such a metal-ceramic substrate, reference is made to the description above of the method according to the invention for producing a metal-ceramic substrate, which description also applies analogously to the metal-ceramic substrate defined above.

According to an advantageous embodiment of the invention, the filler material has a thermal expansion coefficient of less than 75 ppm/K.

Additionally or alternatively, the layer thickness of the filler material on the metallization regions and/or on the ceramic layer can be less than 50 μm.

Furthermore, functional fillers can be added to the filler material, to adapt its thermal expansion coefficient and/or to prevent it from cracking.

Another advantageous embodiment of the invention provides that at least one surface side, on which the trench-shaped intermediate space exists, of the metal-ceramic substrate be substantially completely covered with the filler material.

Particularly preferably, the filler material is a glass material, possibly with additional fillers, as already described herein.

BRIEF DESCRIPTION OF THE DRAWINGS

Additional features and advantages of the invention can be taken from the following description, without limiting them to the exemplary embodiments of the invention explained below in more detail with reference to the drawing. In these drawings, the following is shown schematically:

FIG. 1 a cross-section through a first exemplary embodiment of a metal-ceramic substrate according to the invention, FIG. 2 a cross-section through a second exemplary embodiment of a metal-ceramic substrate according to the invention, and FIG. 3 a cross-section through a third exemplary embodiment of a metal-ceramic substrate according to the invention.

DETAILED DESCRIPTION

In the different figures, parts that are equivalent with regard to their function are always provided with the same reference symbol, such that these parts are also as a rule described only once.

FIG. 1 shows a cross-section through a first exemplary embodiment of a metal-ceramic substrate 1 according to the invention. As can be seen in FIG. 1, the metal-ceramic substrate 1 comprises a ceramic layer 2 and a metal layer 3—in this case, a copper layer—attached to a surface side of the ceramic layer 2. In order to form conductive paths and/or connective surfaces and/or contact surfaces, the metal layer 3 of the metal-ceramic substrate 1 shown is structured into several metallization regions 5 and 6 respectively separated from one another by a trench-shaped intermediate space 4. Such a structuring generally takes place using photolithography and a suitable etching method. Furthermore, the intermediate space 4 is filled with an electrically insulating filler material 7, which is a glass material in the exemplary embodiment shown of the metal-ceramic substrate 1.

As can also be seen in FIG. 1, first edges 8 of the metallization regions 5, 6 facing and adjoining the surface side of the ceramic layer 2 in the intermediate space 4, as well as second edges 9 of the metallization regions 5, 6 facing away from the surface side of the ceramic layer 2 in the intermediate space 4, are covered by the filler material 7.

In the exemplary embodiment of the metal-ceramic substrate 1 shown in FIG. 1, the metal layer 3 is connected to the ceramic layer 2 using the AMB process. Accordingly, the active solder 10 establishing the connection between the metal layer 3 and the ceramic layer 2 is shown between the metal layer 3 or the metallization regions 5 and 6 and the ceramic layer 2. According to the invention, the active solder 10 is considered to be associated with the metal layer 3. Naturally, this active solder 10 is dispensed with when the DCB process is, for example, used to join the metal layer 3 to the ceramic layer 2.

FIG. 2 shows a cross-section through a second exemplary embodiment of a metal-ceramic substrate 11 according to the invention. The metal-ceramic substrate 11 differs from the metal-ceramic substrate 1 shown in FIG. 1 only in that the filler material 7, which is a glass material in this case, has a different cross-section in the trench-shaped intermediate space 4 of the metal-ceramic substrate 11, which cross-section can be produced using a suitable method. In this case, however, the lower first edges 8, as well as the upper second edges 9 in the metal-ceramic substrate 11, are also covered by the filler material 7.

FIG. 3 shows a cross-section through a third exemplary embodiment of a metal-ceramic substrate 12 according to the invention. In the metal-ceramic substrate 12 shown here, the filler material 7, which is a glass material in this case, covers the surface side of the metal-ceramic substrate 12, on which the trench-shaped intermediate space 4 exists, substantially completely, or over its entire surface. Furthermore, the metallization regions 5 and 6 are respectively connected to connectors 13 using appropriate connective surfaces. The connectors 13 have an elongated shape, so that a part of these respectively extends from the metallization region 5 or 6 into a free space 14 surrounding the metal-ceramic substrate 12. The connectors 13 are used for the electrical contact outside of the substrate of the metallization regions 5 and 6.

The method according to the invention described above for producing a metal-ceramic substrate, as well as the associated metal-ceramic substrate, are not limited to the embodiments disclosed herein, but also include other embodiments having the same effect. In particular, the metallization can also be applied to the ceramic layer using the DCB process, so that the active solder layer described in the exemplary embodiments above is dispensed with. Furthermore, the lower side of the ceramic layer can, naturally, also be provided with a metallization, which can also be structured or not. In the case of a structuring of the metallization on the lower side, a filler material can also be introduced in the manner described herein into the trench-shaped intermediate spaces separating the metallization regions.

Furthermore, the invention described above can, in principle, be applied to any type of ceramic substrate, such as AlN (aluminum nitride), $Si_3N_4$ (silicon nitride), $Al_2O_3$ (aluminum oxide), and the like, that can be coated with a metal layer, such as Cu (copper) or Al (aluminum), or an alloy thereof. In doing so, the metallization can be applied to one or both opposite surface sides of the substrate using different methods, such as AMB (Active Metal Brazing), DCB (Direct Copper Bonding), DAB (Direct Aluminum Bonding), the thick layer process, or the like. Particularly preferred are the DCB and AMB ceramic substrates. Herein, the term "substrate" is used synonymously for all the types of substrates mentioned above.

In the preferred embodiment, the metal-ceramic substrate produced using the method according to the invention is used to manufacture electrical circuits—in particular, electrical power circuits.

LIST OF REFERENCE SYMBOLS

1 Metal-ceramic substrate
2 Ceramic layer
3 Metal layer
4 Trench-shaped intermediate space
5 Metallization regions
6 Metallization region
7 Filler material
8 First edges
9 Second edges
10 Active solder
11 Metal-ceramic substrate
12 Metal-ceramic substrate
13 Connector
14 Free space

What is claimed is:

1. A method for producing a metal-ceramic substrate, the method comprising:
    attaching a metal layer to a surface side of a ceramic layer, the metal layer being structured into a plurality of metallization regions respectively separated from one another by at least one trench-shaped intermediate space to form conductive paths and/or connective surfaces and/or contact surfaces;
    filling the at least one trench-shaped intermediate space with an electrically insulating filler material;
    covering first edges of the metallization regions facing and adjoining the surface side of the ceramic layer in the at least one trench-shaped intermediate space, as well as at least one second edge of the metallization regions facing away from the surface side of the ceramic layer in the at least one trench-shaped intermediate space, by the electrically insulating filler material; and
    connecting a connector to a connective surface of the metal-ceramic substrate prior to filling the at least one trench-shaped intermediate space with the electrically insulating filler material, so that at least a section of the connector allows for an external electrical connection to a metallization region and extends from the metallization region into a free space surrounding the metal-ceramic substrate.

2. The method of claim 1, wherein the electrically insulating filler material is filled into the at least one trench-shaped intermediate space before any electric or electronic component is mounted onto the metal layer.

3. The method of claim 1, wherein the electrically insulating filler material is filled into the at least one trench-shaped intermediate space after at least one electric or electronic component is mounted onto the metal layer.

4. The method of claim 1, wherein filling the at least one trench-shaped intermediate space with the electrically insulating filler material comprises:
    introducing the filler material in the form of a powder or a viscous material into the at least one trench-shaped intermediate space; and
    subsequently thermally or chemically treating the powder or the viscous material to harden the filler material.

5. The method of claim 4, further comprising:
    compacting the powder or the viscous material by vibration into the at least one trench-shaped intermediate space.

6. The method of claim 1, wherein at least one surface side of the metal-ceramic substrate, on which the at least one trench-shaped intermediate space exists, is completely covered with the electrically insulating filler material.

7. The method of claim 1, further comprising:
    adding functional fillers to the electrically insulating filler material to adapt a thermal expansion coefficient of the filler material and/or to prevent the filler material from cracking.

8. The method of claim 1, wherein the electrically insulating filler material is a glass material.

9. A method for producing a metal-ceramic substrate, the method comprising:
    attaching a metal layer to a surface side of a ceramic layer, the metal layer having a first surface side which faces the ceramic layer and a second surface side opposite the first surface side, the metal layer being structured into a plurality of metallization regions respectively separated from one another by at least one trench-shaped intermediate space to form conductive paths and/or connective surfaces and/or contact surfaces; and
    filling the at least one trench-shaped intermediate space with an electrically insulating filler material so that the electrically insulating filler material permanently covers:
        first edges of the metallization regions facing and adjoining the surface side of the ceramic layer in the at least one trench-shaped intermediate space;
        second edges of the metallization regions facing away from the surface side of the ceramic layer in the at least one trench-shaped intermediate space; and
        at least a region of the second surface side of the metal layer which adjoins the second edges of the metallization regions.

10. The method of claim 9, the metal layer is attached to the surface side of the ceramic layer by active metal brazing, direct copper bonding or direct aluminum bonding.

* * * * *